US006650758B1

(12) United States Patent
Van Schyndel

(10) Patent No.: US 6,650,758 B1
(45) Date of Patent: Nov. 18, 2003

(54) ADAPTIVE DUAL PORT LOUDSPEAKER IMPLEMENTATION FOR REDUCING LATERAL TRANSMISSION

(75) Inventor: Andre J. Van Schyndel, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/471,092

(22) Filed: Dec. 23, 1999

(51) Int. Cl.[7] ............................ H03G 5/00; H04R 1/02

(52) U.S. Cl. ............................ 381/97; 381/89; 381/335

(58) Field of Search .......................... 381/97, 312, 313, 381/89, 335, 346–350; 181/155, 156

(56) References Cited

U.S. PATENT DOCUMENTS 5,073,945 A * 12/1991 Kageyama et al.
5,212,732 A * 5/1993 Hipps et al. ................ 381/307
5,233,664 A * 8/1993 Yanagawa et al. .......... 381/182
5,828,763 A * 10/1998 Koyano et al. ............... 381/61
5,870,484 A * 2/1999 Greenberger ................ 381/17
6,031,921 A * 2/2000 Mizoguchi .................. 381/182

* cited by examiner

*Primary Examiner*—Forester W. Isen
*Assistant Examiner*—Brian T. Pendleton

(57) ABSTRACT

This invention describes a loudspeaker implementation which can adaptively reduce the transmission of an acoustic signal to listeners other than the intended listener. The invention uses a dipole loudspeaker implementation with two acoustic sources, each of which is driven by a separate signal. By introducing a predetermined phase difference between the signals produced by the two acoustic sources, the null in the standard dipole spatial directivity pattern may be moved to any desired direction. Alternatively, using a microphone close to the unintended listener's ears and a suitable feedback arrangement, the null can adaptively be aligned with the direction of minimum desired sound transmission.

This invention, therefore, provides a solution for applications where it is preferable to reduce the transmission of sound in particular directions while providing the listener with headphoneless audio. In particular, the invention would be effective in applications which involve embedding the implementation into a headrest, seat or other object where the direction of minimum desired transmission is known. Since the invention only involves the use of presently available components, its implementation will not add much cost to an overall system.

16 Claims, 9 Drawing Sheets

ADAPTIVE DUAL PORT LOUDSPEAKER IMPLEMENTATION FOR REDUCING LATERAL TRANSMISSION

FIELD OF THE INVENTION

This invention relates to acoustic transducers and, more particularly, to a multipole loudspeaker implementation which can adaptively reduce the lateral transmission of an acoustic signal.

BACKGROUND OF THE INVENTION

Handsfree communication devices are used extensively where users are required to either communicate for long periods of time or where they require the use of their hands while communicating with others. In such devices, a loudspeaker is used for making received signals audible to a user of the device. As a result, the transmission of audio signals to listeners other than the intended listener is a frequent occurrence and this often results in a compromising of the user's privacy and disruption of his neighbours.

Conventional directional speakers depend on speaker geometry, i.e. cones, horns or reflecting surfaces, and are only directional in a frequency range having corresponding sound wavelengths which are smaller than or comparable to the characteristic size of the speaker. The characteristic size of a speaker is considered to be the largest dimension of the speaker, i.e. either its acoustic driver's largest dimension or the largest dimension of an associated speaker housing. For example, a 334 Hertz (wavelength=1 meter) audio signal would require a conventional directional speaker having a characteristic size of about one meter to provide substantial directionality. This would clearly not be practical in most situations.

Multipole loudspeakers, on the other hand, are directional sound sources which can radiate sound preferably into a specific spatial region exteriorly of the speaker without the use of reflecting surfaces and, more specifically, are able to do so in a frequency range corresponding to sound wavelengths (lambda) which are much greater than the characteristic size of the speaker. Advantageously, privacy is further enhanced as the sound pressure level of multipole speakers attenuates at a faster rate than for regular loudspeakers as the distance from them is increased. For example, in conventional (monopole) speakers, the sound pressure level attenuates at a rate of 6 dB per doubling of distance in the near field while multipole speakers may attenuate at a rate of 12 dB, 18 dB or more per doubling of distance.

The simplest multipole loudspeaker is the dipole loudspeaker. This type of speaker exhibits a 'figure eight' sound directivity pattern consisting of first and second sound pressure lobes extending outward from and substantially in opposite directions from the speaker means. Dipoles also exhibit a null zone lying in a plane perpendicular to a central longitudinal axis of the first and second sound pressure lobes. The directional capabilities of this type of loudspeaker allow it to be oriented such that the main sound pressure lobes are directed toward a user and away form third parties. This provides the user with enhanced privacy.

In general, multipole loudspeakers may be supported in a relative position to an intended listener to direct sound into a specific spatial region conveniently located for alignment with the intended listener's ear. For convenience, the specific spatial region on each side of the loudspeaker is considered in the terminology used hereinafter to be in the form of a sound pressure lobe with a particular directivity pattern. Using a multipole speaker which has a null zone also finds application in wearable handsfree devices, for example, as the speaker can be oriented such that in operation one sound pressure lobe may be directed toward the user's ear, the other lobe directed downward into the shoulder or chest area of the user while the null zone extends laterally away from the user in the direction of third parties. In this case, privacy is a direct consequence of the null plane conveniently extending laterally away from the user in the direction of third parties.

Providing multipole loudspeakers in communication devices which require speakers provides for a less intrusive environment as these loudspeakers are better able to direct reproduced sound in the direction of the user and away from unintended parties. As well, the user of a speaker telephone which incorporates a multipole loudspeaker, for example, will benefit as he or she will be able to listen to a caller or voice mail messages in a handsfree mode with a greater degree of privacy. Multipole loudspeakers may also be used in other personal handsfree communications devices such as terminals or personal computers etc. with the loudspeakers oriented to direct sound into the specific spatial region within which a user's ear would be located.

In applications such as the automotive cellular industry, the use of multipole speakers to reproduce a received voice conversation would provide a similar degree of privacy to a user of a cellular terminal when the terminal is operated in the hands free mode. Specifically, multipole speakers could be supported in a relative position to a user to direct sound into a specific spatial region conveniently located for alignment with, for example, the user's ear with the null planes or smaller sound pressure lobes directed in the general direction of the other seating positions within the automobile. The multipole speakers could be supported in or on a seat head-rest, be supported from the ceiling or even be supported by the door frame assembly.

In all of the above applications, the user is able to directly take advantage of the directionality capabilities of the multipole loudspeaker. In particular, a dipole loudspeaker implementation uses the standard null in its sound directivity pattern to provide a measure of privacy as the unintended listener may most often be assumed to be aligned with the standard null plane. For the most part, this is a valid assumption. However, the privacy afforded by such dipole loudspeaker implementations will be compromised if the unintended listener is, in fact, not aligned with the standard null surface of a dipole implementation.

SUMMARY OF THE INVENTION

The present invention addresses applications where the direction in which the reduction of sound transmission is known, and may not be in the null of a dipole loudspeaker implementation. Using a dipole loudspeaker with two acoustic sources and introducing a pre-determined phase difference between the signals to these two sources, the null can be moved to any specified direction. In addition, a microphone can be placed in the direction of the desired null, and a feedback mechanism can be used to align the null with the direction of minimum desired transmission.

This invention would be particularly effective in applications of a multipole speaker which may involve embedding the implementation into a headrest, a seat, or other object where the direction of minimum transmission is known. Advantageously, the invention uses presently available commercial components and, as such, its implementation should not add much cost to an overall system.

Other aspects and features of the present invention will become apparent to those ordinarily skilled in the art upon review of the following description of specific embodiments of the invention in conjunction with the accompanying drawings.

DESCRIPTION OF THE PREFERRED EMBODIMENTS

Figure 1:
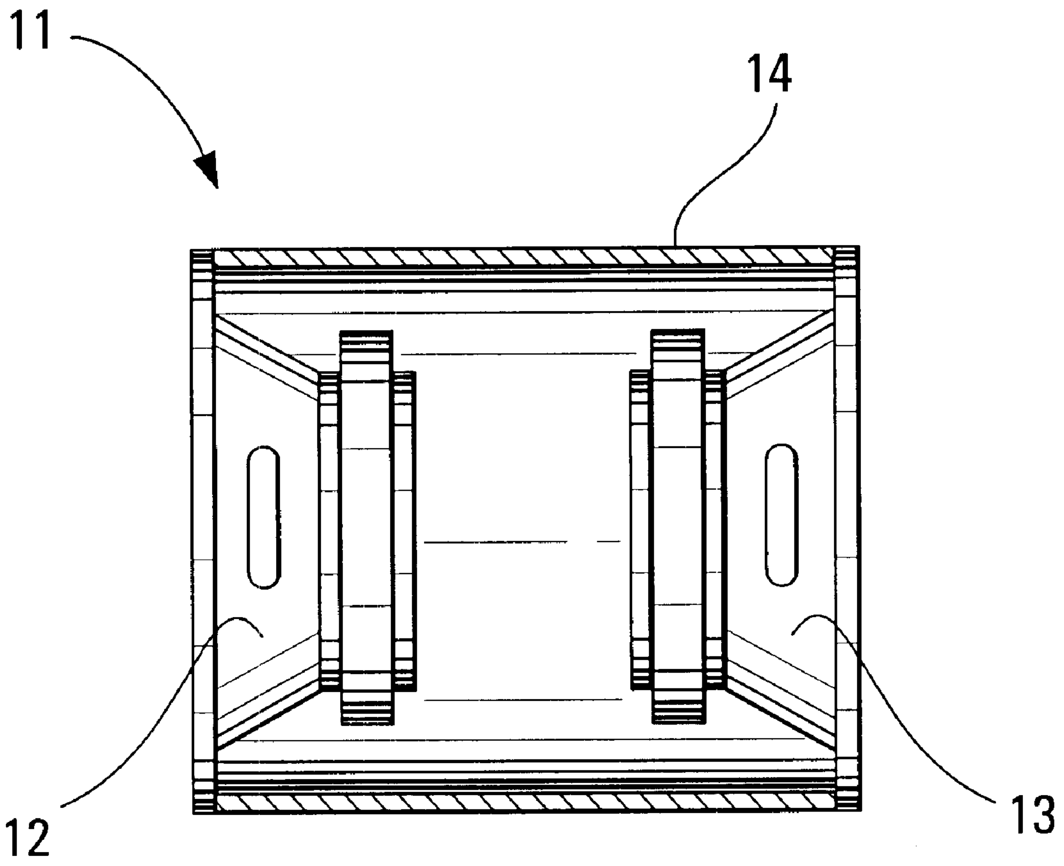
FIG. 1 is a cross-sectional view showing the configuration of a two-driver dipole loudspeaker.

This invention enables alignment of the null surface in the sound directivity pattern of a two-driver dipole loudspeaker implementation with a direction of minimum desired transmission. A two-driver dipole loudspeaker 11 is depicted in FIG. 1. Two acoustic drivers or sources 12, 13 are disposed within and at each end of a cylindrical housing 14. The acoustic drivers 12, 13 are in the form of cone-shaped diaphragms in sealing contact with the walls of the housing and both face outward. It will be appreciated by persons skilled in the art that the acoustic drivers 12, 13 are driven by respective electrical drivers to which an electrical audio signal is fed.

Having the acoustic drivers 12, 13 in sealing contact with the walls of the cylindrical housing 14 better enables them to create a positive volume velocity of air on one side of their respective driver diaphragms and an equal negative volume velocity of air on the other side which are requirements of a dipole loudspeaker. Thus an apparent positive velocity source may be realized at one end of the cylindrical housing 14 and an equal (in magnitude) apparent negative velocity source similarly created at the opposite end of the housing to produce a characteristic dipole directivity pattern having two equal and opposite directional sound pressure lobes. Essentially, then, the two-driver dipole loudspeaker implementation comprises two point-source volume velocity generators which will be referred to hereinafter as, simply, acoustic sources. In an ideal case, the acoustic source may be viewed as the opening where the acoustic volume velocity opens into the free field.

Other orientations of the acoustic drivers 12, 13 within the housing are possible i.e. both facing inward, one facing in and one facing out. The requirement for dipole operation is, however, that the diaphragms or acoustic drivers move in phase relative to one another. For the two-driver dipole speaker 11 with both acoustic drivers 12, 13 facing outward, each driver must be electrically wired to operate 180 degrees out of phase to effectively have the respective speaker diaphragms operating in phase (i.e. one driver diaphragm moves outward of the housing while the other driver diaphragm moves inward).

The directional sound pattern of a multipole loudspeaker depends on the positions of the acoustic sources, their relative strengths, and their relative phase. In the case of a dipole loudspeaker, like that shown in FIG. 1, even strength acoustic sources (with opposite sign) provide a null plane half way between the sources, with a normal defined by a line connecting the sources. When the distance between the sources is very much less than a wavelength, the pressure on this null plane due to the sources is essentially zero because the pressure due to one source is cancelled by that of the other.

Figure 2:
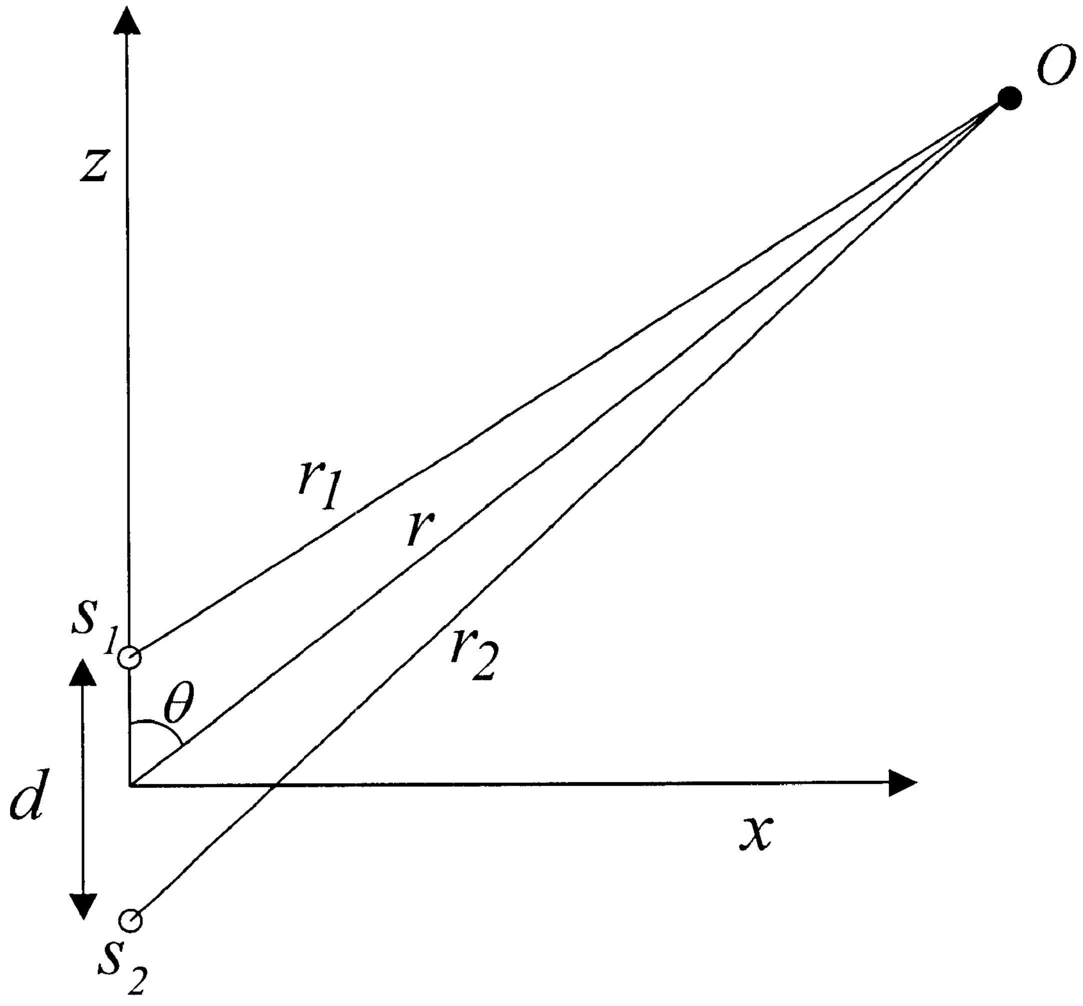
FIG. 2 is a diagram depicting the separation of acoustic sources of the dipole loudspeaker of FIG. 1 and their relation to an observation point in the X-Z plane.

The dependence of the null surface on the strength of the sources and their relative phase may be illustrated for a dipole implementation with reference to FIG. 2. Here, a first source $s_1$ is located at (0,0,d/2) and a second source $s_2$ is located at (0,0,−d/2). The pressure around the sources $s_1$ and $s_2$ is rotationally symmetric about the z-axis and, therefore, only the x-z plane needs to be considered. At a given angular frequency, ω, the pressure P measured from each source $s_1$, $s_2$ at an observation point O may be defined in general as $$P = \frac{p_1}{r} e^{j(\omega t - k|r|)} \qquad \text{equation (1)}$$

where $p_1$ is the strength of the source $s_1$ or $s_2$ measured at unit distance, r is the distance from the source to the observation point O, k=ω/c is the wave number and c is the speed of sound. Allowing for a phase difference, δ, between the sources $s_1$ and $s_2$, the total pressure, $P_T$, at point O is simply the sum of the pressures from the individual sources or $$P_T = \frac{p_1}{r_1} e^{j(\omega t - k|r_1|)} + \frac{p_2}{r_2} e^{j(\omega t - k|r_2| + \delta)} \qquad \text{equation (2)}$$

For $r_1$,$r_2$>>d it is evident from FIG. 2 that $$|r_1| = r - d/2 \cos\theta \qquad \text{equation (3)}$$

and $$|r_2| = r + d/2 \cos\theta \qquad \text{equation (4)}$$

Substituting equations (3) and (4) into equation (2) yields a total pressure of $$P_T = \frac{p_1}{r} e^{j(\omega t - kr)}\left[\left(1 + \frac{p_2}{p_1}\right) + \left(1 - \frac{p_2}{p_1}\right)\left(jk\frac{d}{2}\cos\theta\right) + j\frac{p_2}{p_1}\delta\right] \qquad \text{equation (5)}$$

For a null to exist, the real and imaginary parts of equation (5) must each be zero. Satisfying these conditions, the following relationships may be found:

$$p_2 = -p_1 \qquad \text{equation (6)}$$

$$\delta = -d/c\omega \cos\theta \qquad \text{equation (7)}$$

The above requirements may be used to control the direction of the null in the sound field pattern produced by the two acoustic sources of a dipole implementation. In the particular case when the null is desired in the x-z plane of FIG. 2, for example, it follows that θ=90°.

It should be noted here that the phase difference defined by equation (7) is directly proportional to ω, implying that a corresponding time delay, τ, defined by $$\tau=-d/c\cos\theta \qquad \text{equation (8)}$$

may be introduced between the signals to the two acoustic sources $s_1$ and $s_2$.

Figure 3A:
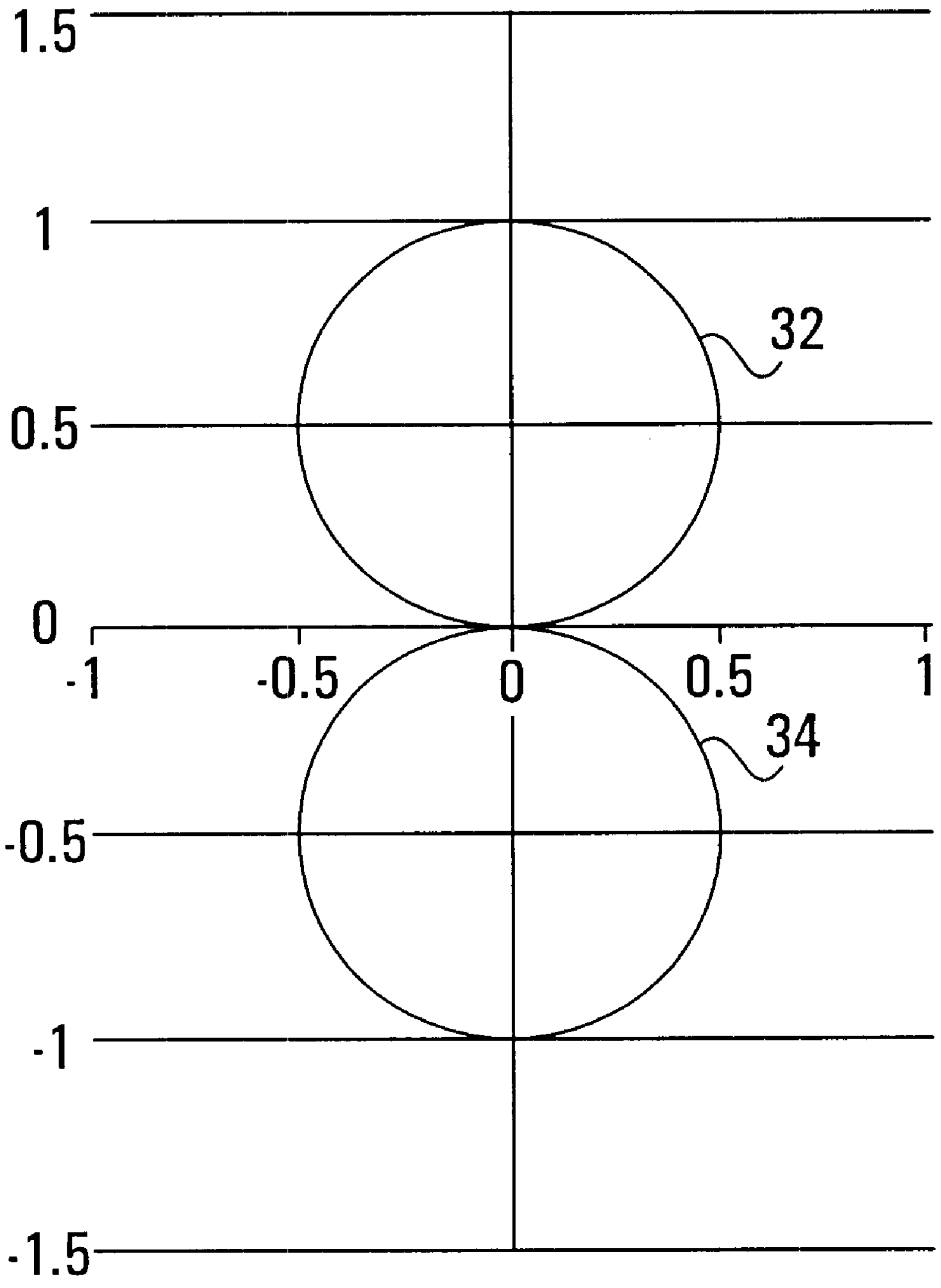
FIG. 3A is a two-dimensional polar plot of the ideal dipole directivity pattern for a two-driver dipole loudspeaker having a null at 90 degrees.
Figure 3B:
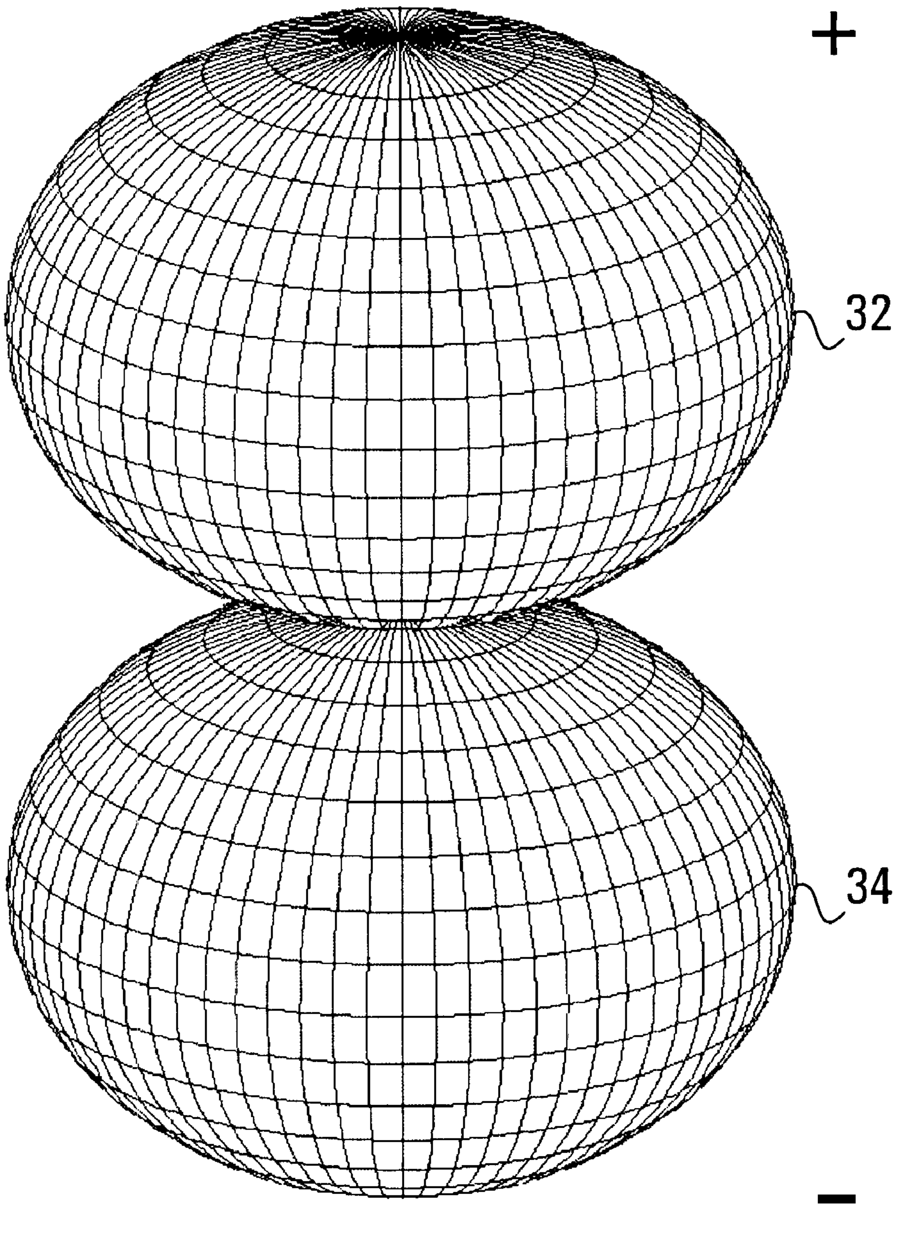
FIG. 3B is a three-dimensional polar plot of the ideal dipole directivity pattern in FIG. 3A.

The present invention applies to a two-driver dipole loudspeaker implementation as shown in FIG. 1. As mentioned, there are two acoustic sources in such an arrangement. If the sources are equal in amplitude but opposite in sign, and if there is zero phase difference (δ=0) between the sources, the amplitude measured at a distance is described by a sound directivity pattern graphically illustrated in FIGS. 3*a* and 3*b*. This 'figure eight' polar pattern comprises a positive sound pressure lobe 32 and a negative sound pressure lobe 34. Each sound pressure lobe 32, 34 will extend outward from and in opposite directions from the loudspeaker i.e. axially away from the speaker. As discussed, dipoles exhibit a null zone lying in a plane perpendicular to a central longitudinal axis of the positive and negative sound pressure lobes 32, 34. If the upward direction is taken as 0 degrees, it is evident from FIG. 2 that the amplitude is maximum at 0 degrees and zero at 90 degrees.

Figure 4A:
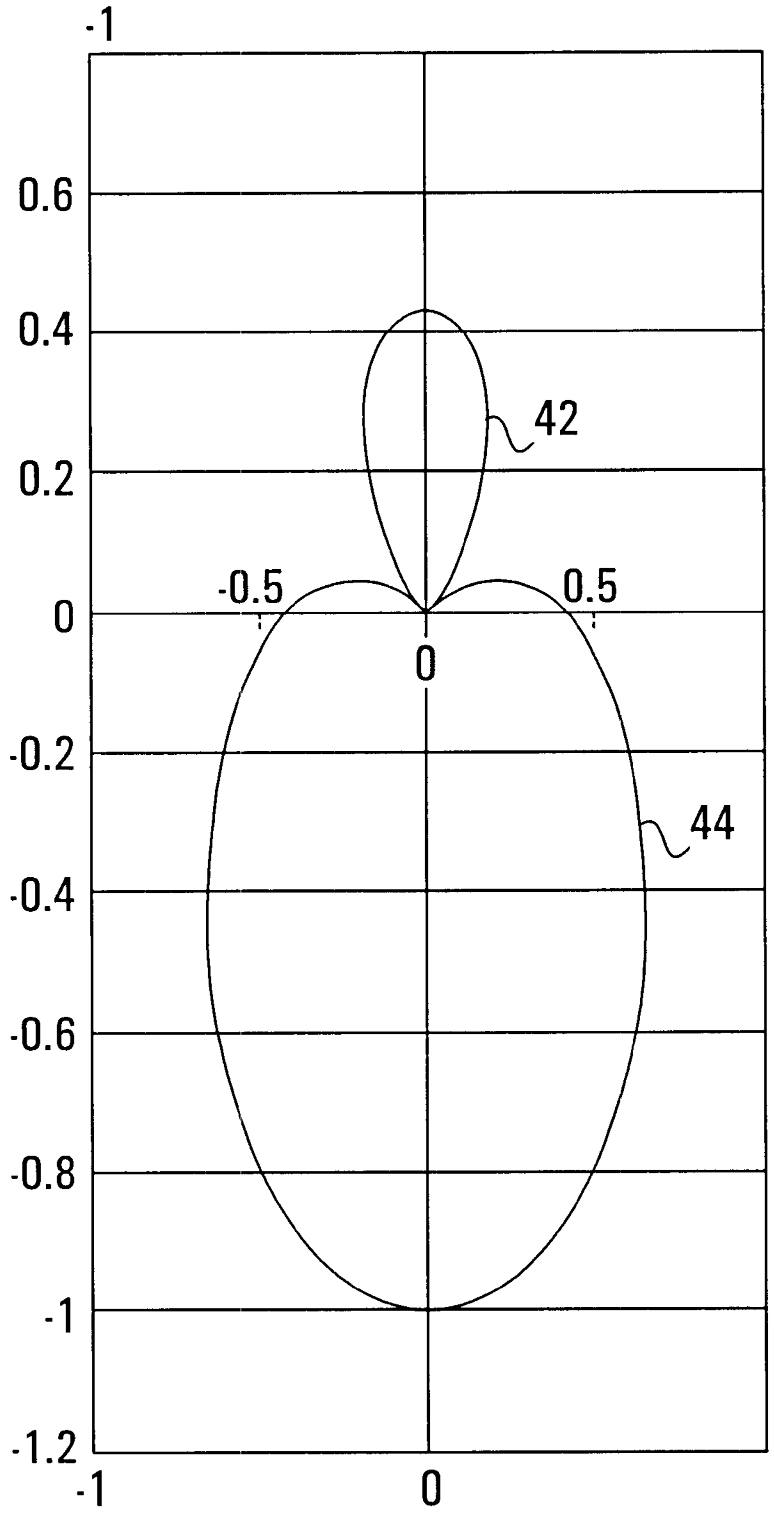
FIG. 4A is a two-dimensional polar plot of the sound directivity pattern for a two-driver dipole loudspeaker having a null at 65 degrees.
Figure 4B:
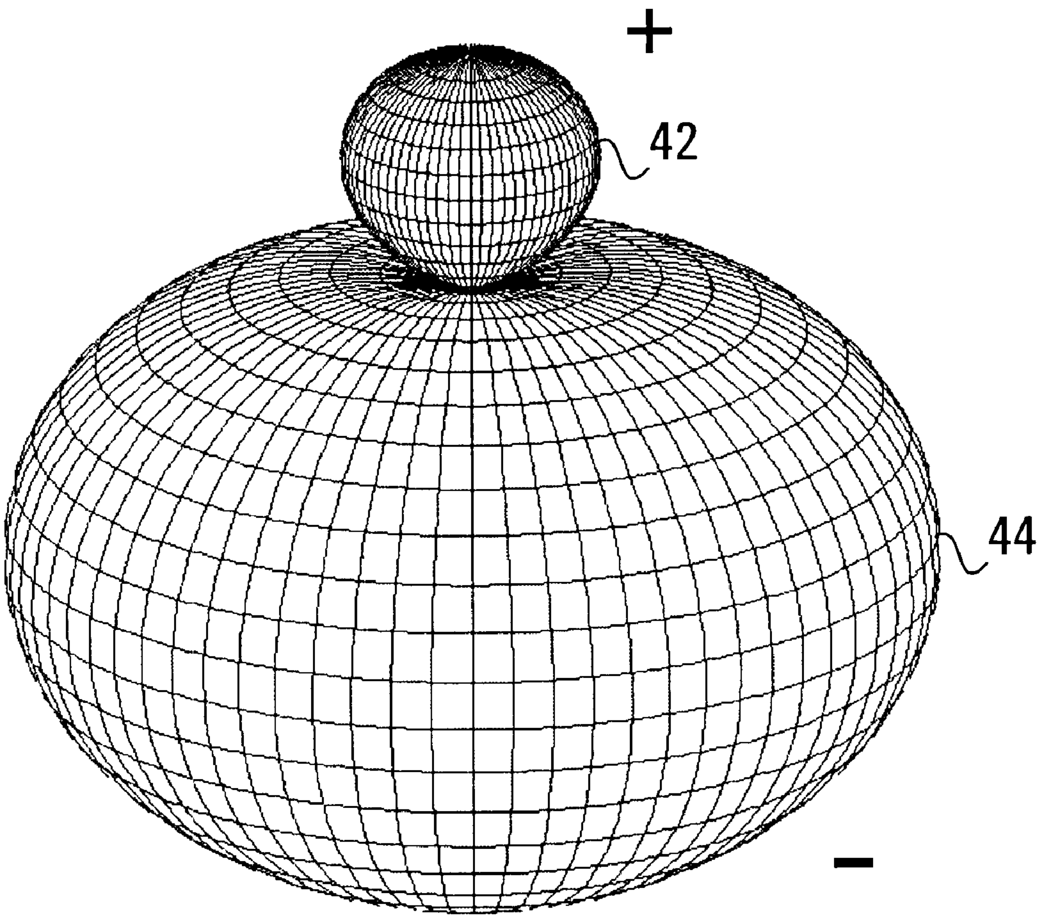
FIG. 4B is a three-dimensional polar plot of the sound directivity pattern in FIG. 4A.

However, by introducing a phase difference between the two sources, the null direction can be moved as shown in FIGS. 4*a* and 4*b*. Here, a positive sound pressure lobe 42 and a negative sound pressure lobe 44 still exist. The desired null direction was θ=65°≅1.134 radians. To point the null in this direction, the amplitudes should again be equal and opposite in sign, but the phase difference between the sources should now be maintained at δ=−d/c ωcos(1.134). Note that the phase difference is a function of the frequency. In the particular example of FIG. 4, the frequency is taken as $$\frac{\omega}{2\pi}=1000\text{ Hz,}$$

the separation of the acoustic sources is d=12 mm, the speed of sound is c=344 m/s, yielding a phase difference of $$\delta=-d/c\omega\cos(1.134)\cong-0.0926\text{ radians}\cong-5.3^\circ$$

It is apparent from FIGS. 4*a* and 4*b* that the maximum still occurs at 0 degrees, but the zero or null now occurs at 65 degrees.

Figure 5A:
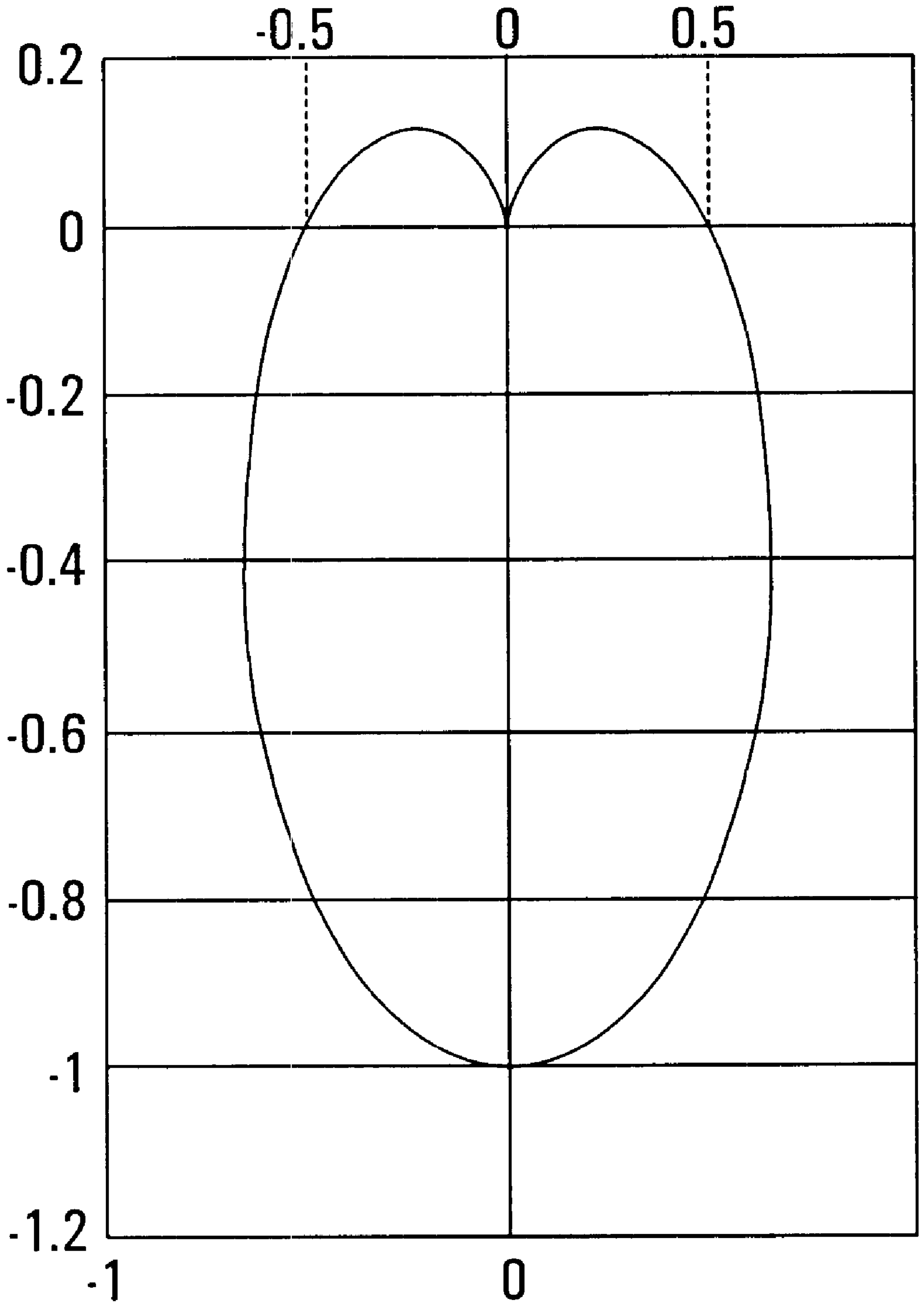
FIG. 5A is a two-dimensional polar plot of the sound directivity pattern for a two-driver dipole loudspeaker having a null at 0 degrees.
Figure 5B:
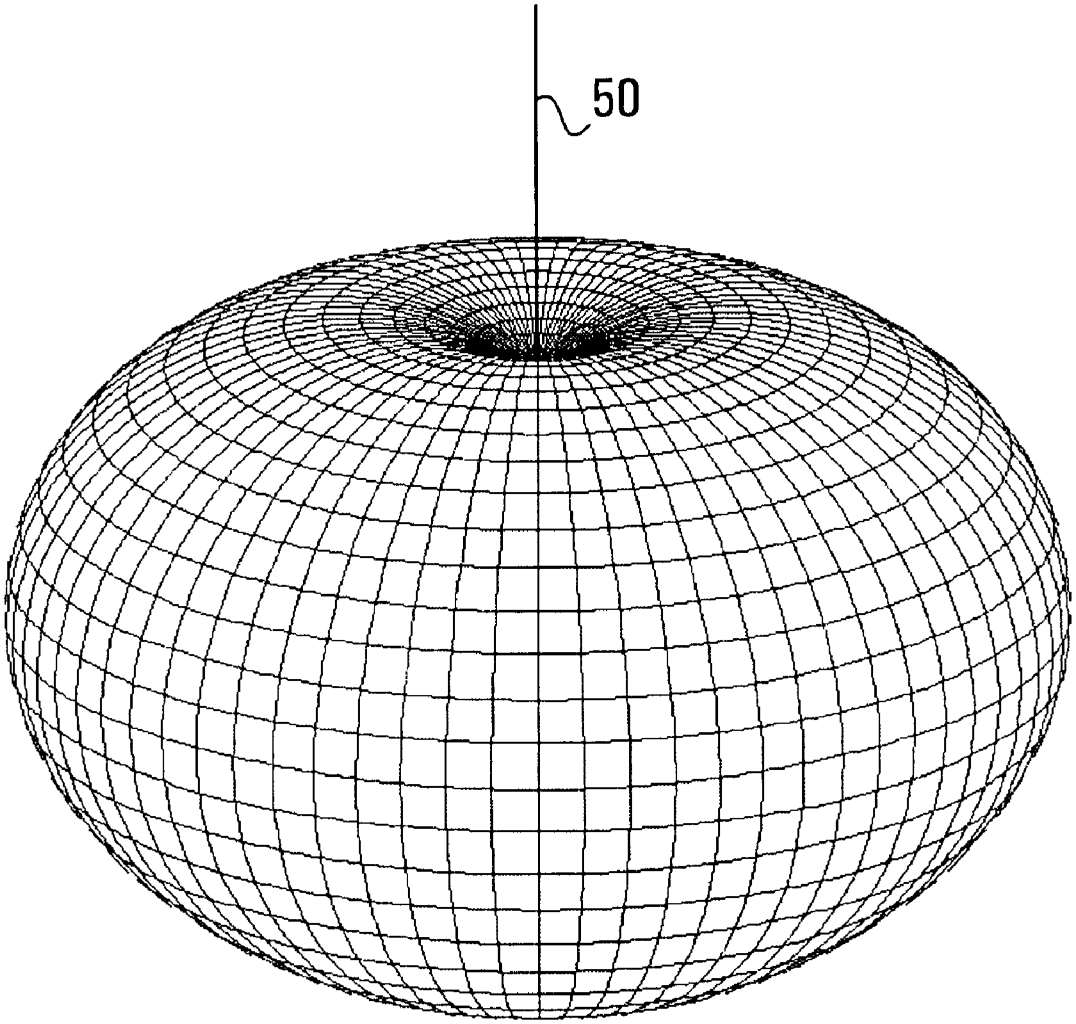
FIG. 5B is a three-dimensional polar plot of the sound directivity pattern in FIG. 5A.

In fact, the angle of no transmission can be altered to any angle between 0 and 180 degrees. For example, FIGS. 5*a* and 5*b* depict a sound directivity pattern for which there will be no transmission behind one end of a loudspeaker by moving the null direction 50 to 0 degrees. For any particular frequency, then, if the signal to one source is time delayed with respect to the other source, the null plane becomes a null surface with an asymptote in a particular direction.

If the desired angle of the null is known, the invention can be used to point or steer the null in that direction. Alternatively, by using acoustic sensors such as microphones, the null surface may be optimized adaptively for a particular direction. That is, the null surface can be steered to adaptively follow a microphone with a servo feedback arrangement as illustrated in FIG. 6.

In this configuration, an electrical audio signal 601 derived from a remote audio source (not shown) is fed into a Null Direction Control module 602. A first output 603 of the Null Direction Control module 602 feeds into a first electrical loudspeaker driver 605 while a second output 604 feeds into a second electrical loudspeaker driver 606. The output of the first loudspeaker driver 605 is in phase with the audio signal 601 and is provided to drive a first acoustic source $s_1$ of a dipole loudspeaker 600. The output of the second loudspeaker driver 606 is 180 degrees out of phase with respect to the audio signal 601 and is provided to a second acoustic source $s_2$ of the loudspeaker 600. The audio signal 601 also passes through a fixed time delay circuit 607 to produce a delayed audio signal 608 which is then fed into a multiplier 613.

An acoustic signal from the dipole loudspeaker 600 is captured by a microphone 609 and is converted to an electrical audio signal which is fed through a microphone amplifier 610 to a filter 611. The output 612 of the filter 611 is then fed into the multiplier 613 which has the delayed audio signal 608 as its other input. The output of the multiplier 614 is passed through a gating function 615 and into a first integrator 616 whose output 617 is then fed into a second integrator 618. Finally, the output of the second integrator 619 is then input into the Null Direction Control module 602.

Figure 6:
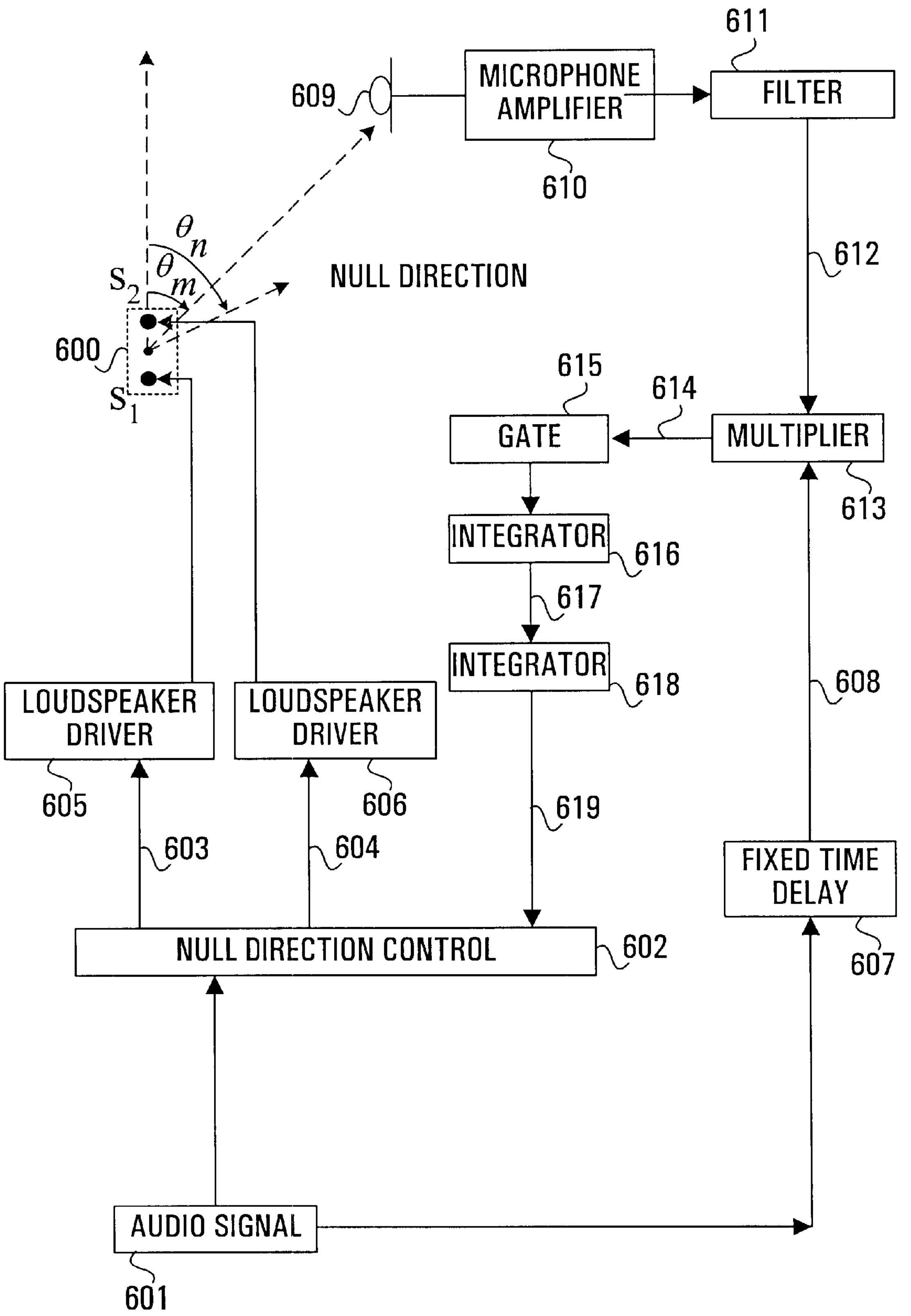
FIG. 6 illustrates a servo feedback arrangement used to adaptively align the null of a dipole loudspeaker such as that of FIG. 1 in the direction of a microphone.

The desired null direction can be anywhere from 0 degrees (upward in FIG. 6) to 180 degrees (downward in FIG. 6). The direction pointing to the microphone (desired null direction) is represented by the angle $\theta_m$ and the direction pointing to the current null direction is represented by the angle $\theta_n$. In general, the microphone signal will be proportional to $\sin(\theta_m-\theta_n)$. Note that if $\theta_m<\theta_n$ i.e. the null is below the microphone, the microphone signal will be inverted (i.e. 180 degrees out of phase) from the electrical audio signal.

In FIG. 6, the electrical audio signal 601 is delayed by a fixed time equal to the acoustic time of transit from the loudspeaker 600 to the microphone 609. The microphone 609 will sense an audio signal from the loudspeaker 600 which is 180 degrees out of phase with the delayed audio signal 608 since the null is below the microphone 609. Note that if the microphone 609 were below the null, its signal would be in phase with the delayed audio signal 608. Furthermore, the microphone signal will grow in amplitude as the null moves farther away from the microphone 609.

The microphone 609 senses an acoustic signal from the dipole loudspeaker 600 which, when converted to a corresponding audio signal, is very similar to the delayed audio signal 608. Slight differences are mainly attributable to the non-unity transfer function through the acoustic transducers and the acoustic path between the dipole loudspeaker 600 and the microphone 609. These differences can be minimized with the use of the filter 611 which filters out the parts of the spectrum were the main differences occur. The filter 611 would at least incorporate a low pass component.

When the amplified and filtered signal 612 is multiplied by the delayed audio signal 608, the resulting output signal 614 will be proportional to the angle that the microphone is away from the null. This signal can then be used to steer the null in the direction of the microphone 609.

For example, according to FIG. 6, the output of the filter 612 and the delayed electrical audio signal 608 are fed into the multiplier 613 whose output 614 is then averaged by means of the first integrator 616. The result is essentially a DC signal 617 proportional to $\sin(\theta_m-\theta_n)$. If $\theta_m<\theta_n$, this DC signal 617 is negative indicating that the current null direction needs to be moved to a smaller angle. In addition, the farther the microphone 609 is away from the null (i.e. the greater the absolute value of $\theta_m-\theta_n$), the larger the absolute value of the DC signal 617.

The DC signal 617 represents the angular displacement between the microphone and null directions rather than the absolute angle of the current null direction. Therefore, this signal will be zero when the null is aligned with the microphone 609. Using the second integrator 618, this difference signal will adaptively become the absolute angle of the null plane needed for the Null Direction Control module 602. The 'Null Direction Control' module 602 is a signal processor that for an input signal proportional to the desired direction ($\theta$), alters the phase of the audio electrical signal fed to one or both of the electrical loudspeaker drivers 605, 606 to provide a phase difference in the audio signal fed to one driver relative to the audio signal fed to the other driver. This phase difference corresponds to the phase difference between the acoustic waves derived by the acoustic sources $s_1$, $s_2$ in accordance with equation (7).

In any case, when the system of FIG. 6 has converged i.e. the null plane is aligned with the direction of the microphone, the output of the multiplier 614 is essentially zero since one of its inputs, namely the output of the filter 612, is zero. Therefore, the output of the first integrator 617 is essentially zero, and the output of the second integrator 619 is the input voltage for which the Null Direction Control module 602 points the null in the direction of the microphone, $\theta_m$. That is, $$\theta_m=\theta_n \text{ and } \delta=-d/c\omega \cos \theta_m$$

If the audio signal picked up by the microphone 608 is less than the noise (which could be audio signals picked up by the microphone which were not caused by the loudspeaker and/or electrical noise in the system), the direction will move inappropriately. In such a situation, the gating function 615 is used to freeze the null direction, $\theta_n$, when insufficient audio is present.

Although the invention has been described in the context of conventional handsfree communication devices such as speaker telephones and handsfree cellular terminals, it should be noted that the invention may apply to any other radio or directional sound source. In addition, the invention is not specifically limited to a dipole loudspeaker implementation. It will be appreciated by those skilled in the art that the theory may be extended for higher orders of a multipole speaker.

The implementation depicted in FIG. 6 comprises standard components which may be realized using a combination of both commercially available hardware and software. For example, with regards to the microphone and microphone amplifier, a wide variety of microphones are currently in the market that would suffice for this application. An example of a suitable, cost-effective omnidirectional microphone is the WM-62 from Panasonic. An example of a suitable cardiod microphone is the EM-83 from Primo Microphones.

The loudspeaker drivers 605, 606 may be standard analog amplifiers capable of delivering sufficient power to the dipole loudspeaker sources $s_1$, $s_2$. Suitable parts are commercially available for essentially all loudspeaker elements. The dipole loudspeaker 600 may be built from commercially available loudspeaker elements as described above. In its simplest form, the filter 611 would be low pass (one or two poles) as the largest differences introduced by the acoustic elements occur at high frequencies. Standard LCR hardware filters or FIR DSP filters would be suitable.

Although the fixed time delay 607 is most easily constructed in DSP architectures, analog delay circuits may also be appropriate. The multiplier 613, gating function 615 and integrators 616, 618 may most easily be implemented in standard DSP code. However, analog components for all these elements are also commercially available. Finally, the Null Direction Control module 602 can be constructed using DSP code or conventional delay devices. For an input signal proportional to the desired direction, the DSP code alters the signal to one or both of loudspeaker drivers such that their phase difference is maintained according to equation (7).

While preferred embodiments of the invention have been described and illustrated, it will be apparent to one skilled in the art that numerous modifications, variations and adaptations may be made without departing from the scope of the invention as defined in the claims appended hereto.

What is claimed is:

1. A directional sound source comprising a dipole loudspeaker having two acoustic sources driven by two respective electrical drivers, an audio input connected to feed an audio signal to the two electrical drivers, a null direction control means connected to the audio input to introduce a phase difference into the audio signal fed to one of the two electrical drivers relative to the other of the two electrical drivers, a microphone for sensing acoustic signals from the dipole loudspeaker and locatable in a plane in which it is desired that acoustic signals at all audible frequencies from the dipole loudspeaker be minimum such that the sound is substantially inaudible and a feedback circuit interconnecting the microphone with the null direction control means such that the null direction control means adaptively introduces the phase difference until the acoustic signals at all audible frequencies sensed by the microphone are minimum.

2. A directional sound source according to claim 1 wherein the feedback circuit further comprises a multiplier having a first input connected at least indirectly to an output of the microphone, a second input connected to an output of a time delay unit having an input connected to the audio input, and an output connected to the null direction control means.

3. A directional sound source according to claim 2, wherein the feedback circuit further comprises a microphone amplifier and filter connected between the microphone and the first input of the multiplier.

4. A directional sound source according to claim 3, wherein the feedback circuit further comprises a gate and integrator connected between the output of the multiplier and the null direction control means.

5. A null direction control module for connection to an audio input of a dipole loudspeaker having two acoustic sources driven by two respective electrical drivers, wherein the null direction control module is arranged to introduce a phase difference into the audio signal fed to one of the electrical drivers relative to the audio signal fed to the other of the electrical drivers thereby to vary the direction of a null plane of the dipole loudspeaker further comprising a null direction control means having outputs connectable respectively to the two electrical drivers, an input connected to the audio input and a further input connected to one end of a feedback circuit the other end of which is connected to an output by a microphone locatable in a desired null plane such that the null direction control means adaptively introduces the phase difference until acoustic signals at all audible frequencies sensed by the microphone are minimum.

6. A null direction control module according to claim 5, wherein the feedback circuit further comprises a multiplier having a first input connectible at least indirectly to an output of the microphone, a second input connected to an output of a time delay unit having an input connected to the audio input, and an output connected to the null direction control means.

7. A null direction control module according to claim 6, wherein the feedback circuit further comprises a microphone amplifier and filter connected between the microphone and the first input of the multiplier.

8. A null direction control module according to claim 7, wherein the feedback circuit further comprises a gate and integrator connected between the output of the multiplier and the null direction control means.

9. A directional sound source comprising a dipole loudspeaker having two acoustic sources driven by two respective electrical drivers, an audio input connected to feed an audio signal to the two electrical drivers, a null direction control means connected to the audio input to introduce a phase difference into the audio signal fed to one of the two electrical drivers relative to the other of the two electrical drivers, a microphone for sensing acoustic signals from the dipole loudspeaker and locatable in a plane in which it is desired that acoustic signals from the dipole loudspeaker be minimum and a feedback circuit interconnecting the microphone with the null direction control means such that the null direction control means adaptively introduces the phase difference until the acoustic signals sensed by the microphone are minimum.

10. A directional sound source according to claim 9, wherein the feedback circuit further comprises a multiplier having a first input connected at least indirectly to an output of the microphone, a second input connected to an output of a time delay unit having an input connected to the audio input, and an output connected to the null direction control means.

11. A directional sound source according to claim 10, wherein the feedback circuit further comprises a microphone amplifier and filter connected between the microphone and the first input of the multiplier.

12. A directional sound source according to claim 11, wherein the feedback circuit further comprises a gate and integrator connected between the output of the multiplier and the null direction control means.

13. A null direction control module for connection to an audio input of a dipole loudspeaker having two acoustic sources driven by two respective electrical drivers, wherein the null direction control module is arranged to introduce a phase difference into the audio signal fed to one of the electrical drivers relative to the audio signal fed to the ocher of the electrical drivers thereby to vary the direction of a null plane of the dipole loudspeaker further comprising a null direction control means having outputs connectable respectively to the two electrical drivers, an input connected to the audio input and a further input connected to one end of a feedback circuit the other end of which is connected to an output by a microphone locatable in a desired null plane such that the null direction control means adaptively introduces the phase difference until acoustic signals sensed by the microphone are minimum.

14. A null direction control module according to claim 13, wherein the feedback circuit further comprises a multiplier having a first input connectible at least indirectly to an output of the microphone, a second input connected to an output of a time delay unit having an input connected to the audio input, and an output connected to the null direction control means.

15. A null direction control module according to claim 14, wherein the feedback circuit further comprises a microphone amplifier and filter connected between the microphone and the first input of the multiplier.

16. A null direction control module according to claim 15, wherein the feedback circuit further comprises a gate and integrator connected between the output of the multiplier and the null direction control means.

* * * * *

UNITED STATES PATENT AND TRADEMARK OFFICE
CERTIFICATE OF CORRECTION

PATENT NO. : 6,650,758 B1 
DATED : November 18, 2003
INVENTOR(S) : Andre J. Van Schyndel et al.

It is certified that error appears in the above-identified patent and that said Letters Patent is hereby corrected as shown below:

Column 10,
Line 8, change "ocher" to -- other --

Signed and Sealed this

Ninth Day of November, 2004

JON W. DUDAS
*Director of the United States Patent and Trademark Office*